(12) United States Patent
Tung et al.

(10) Patent No.: US 7,704,647 B2
(45) Date of Patent: Apr. 27, 2010

(54) MASK AND MANUFACTURING METHOD THEREOF

(75) Inventors: Chun-Hao Tung, Taoyuan (TW);
Chia-Tsung Lee, Taoyuan (TW);
Hsien-Kai Tseng, Taoyuan (TW);
Horino Shigekazu, Taoyuan (TW)

(73) Assignee: Au Optronics Corp., Hsinchu (TW)

( * ) Notice: Subject to any disclaimer, the term of this patent is extended or adjusted under 35 U.S.C. 154(b) by 817 days.

(21) Appl. No.: 11/444,546

(22) Filed: May 31, 2006

(65) Prior Publication Data

US 2007/0059611 A1 Mar. 15, 2007

(30) Foreign Application Priority Data

Sep. 9, 2005 (TW) .............................. 94131047 A

(51) Int. Cl.
*G03F 1/00* (2006.01)

(52) U.S. Cl. .......................................... 430/5; 430/311

(58) Field of Classification Search ..................... 430/5, 430/311, 322
See application file for complete search history.

(56) References Cited

U.S. PATENT DOCUMENTS

| 5,368,963 | A | * | 11/1994 | Hanyu et al. | 430/5 |
| 5,418,095 | A | | 5/1995 | Vasudev et al. | 430/5 |
| 5,482,799 | A | | 1/1996 | Isao et al. | 430/5 |
| 5,658,695 | A | * | 8/1997 | Choi | 430/5 |
| 5,792,578 | A | * | 8/1998 | Tzu et al. | 430/5 |
| 5,935,733 | A | * | 8/1999 | Scott et al. | 430/5 |
| 7,648,804 | B2 | * | 1/2010 | Tung | 430/5 |
| 2002/0039690 | A1 | | 4/2002 | Inazuki et al. | 430/5 |
| 2002/0102469 | A1 | * | 8/2002 | Dulman et al. | 430/5 |
| 2002/0155359 | A1 | * | 10/2002 | Muzio et al. | 430/5 |

FOREIGN PATENT DOCUMENTS

| JP | 2000-010255 | 1/2000 |
| JP | 2000-027798 | 1/2000 |

* cited by examiner

*Primary Examiner*—Mark F Huff
*Assistant Examiner*—Stewart A Fraser
(74) *Attorney, Agent, or Firm*—J.C. Patents

(57) ABSTRACT

A mask and a manufacturing method thereof are provided. A transparent substrate having three regions is provided first. A non-transmitting layer is formed in a first region of the transparent substrate. Then, a first photoresist layer is formed on the transparent substrate, and the first photoresist layer exposes a second region of the transparent substrate. Next, a first transmitting layer is formed on the transparent substrate and the first photoresist layer. Finally, the first photoresist layer is removed. The first transmitting layer on the first photoresist layer is removed at the same time and the first transmitting layer in the second region of the transparent substrate is remained and a third region of the transparent substrate is exposed. A lift-off process is used in the mask manufacturing method of the present invention to form the transmitting layer.

5 Claims, 18 Drawing Sheets

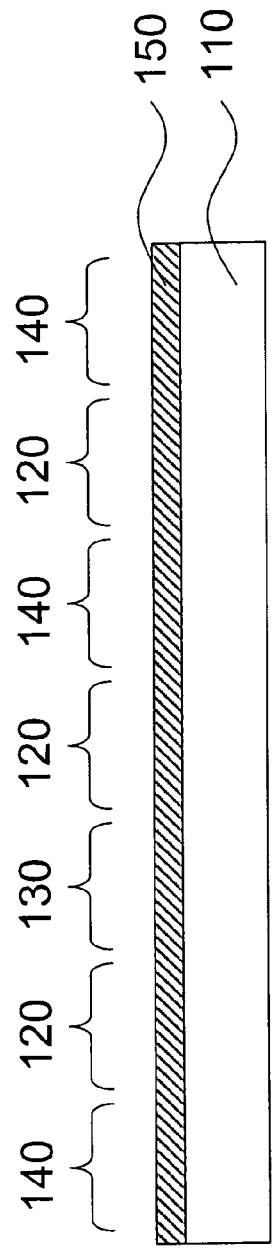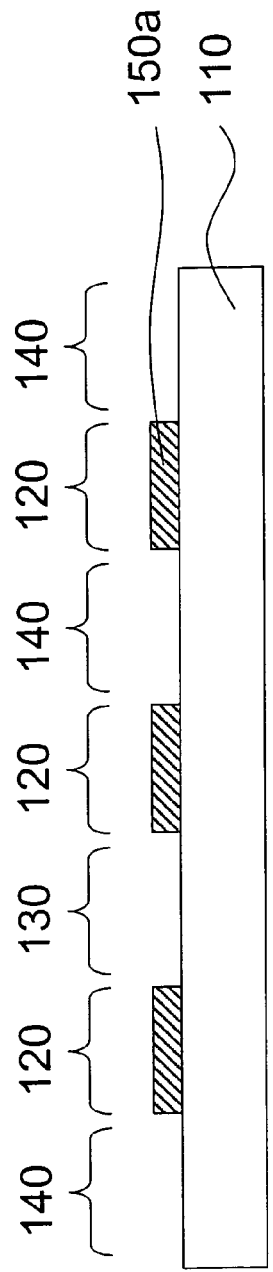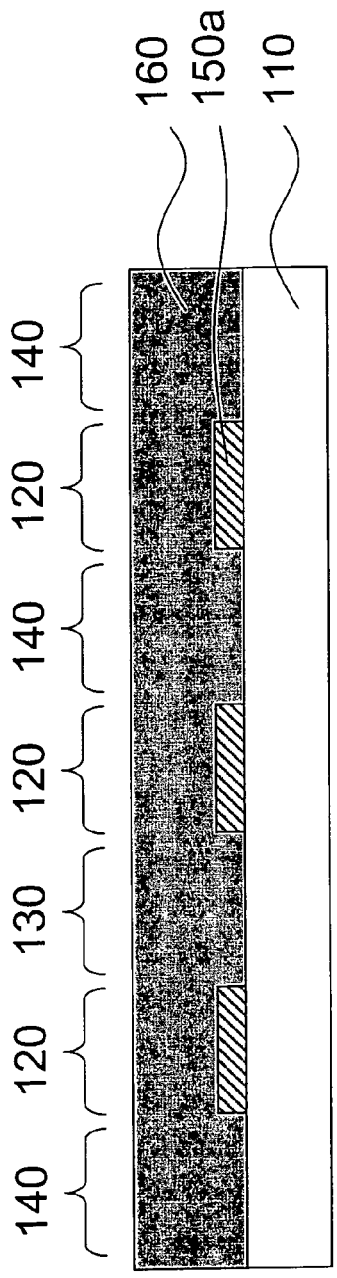

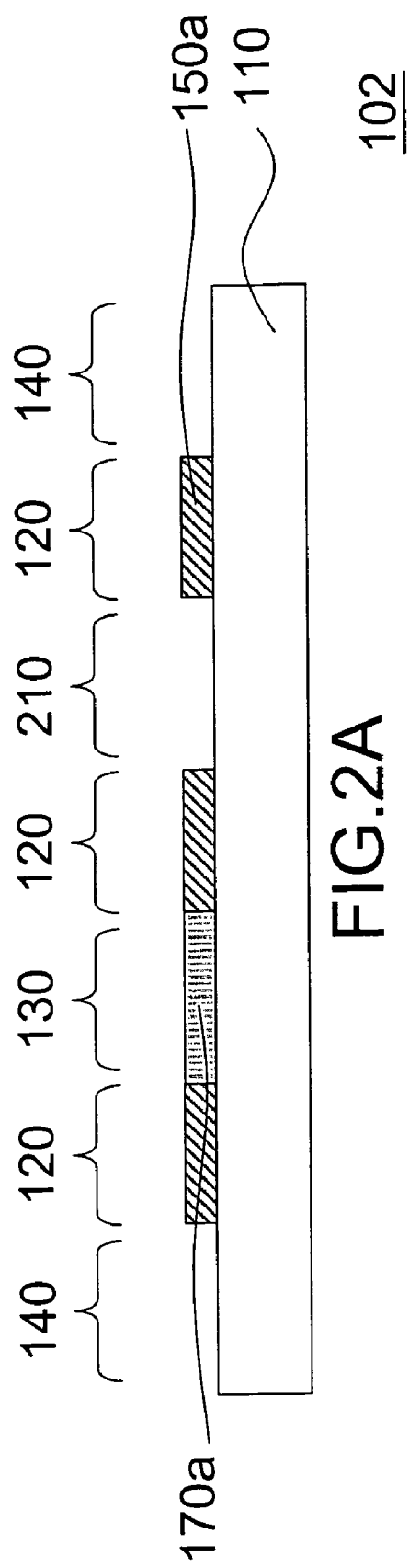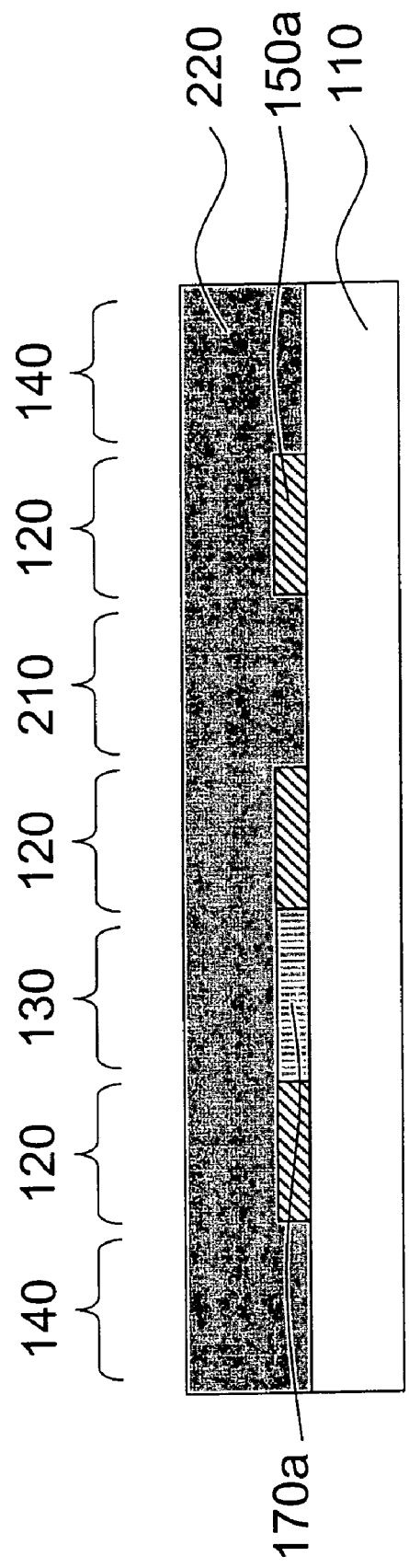

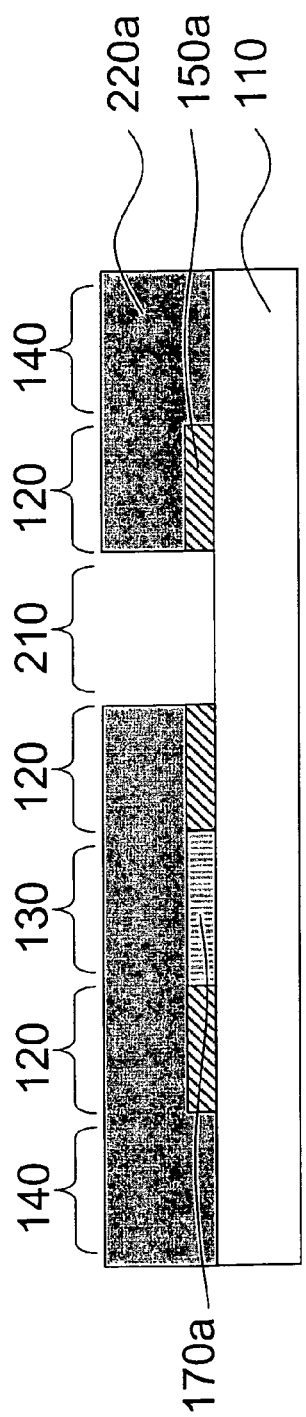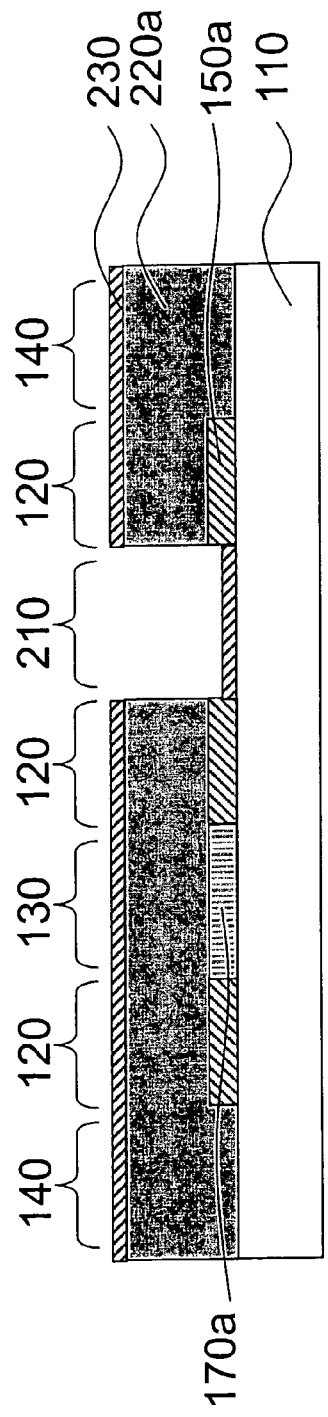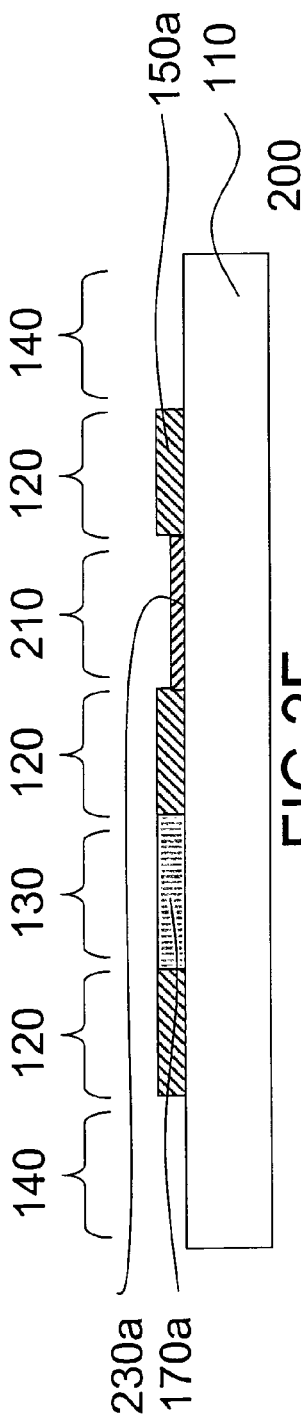

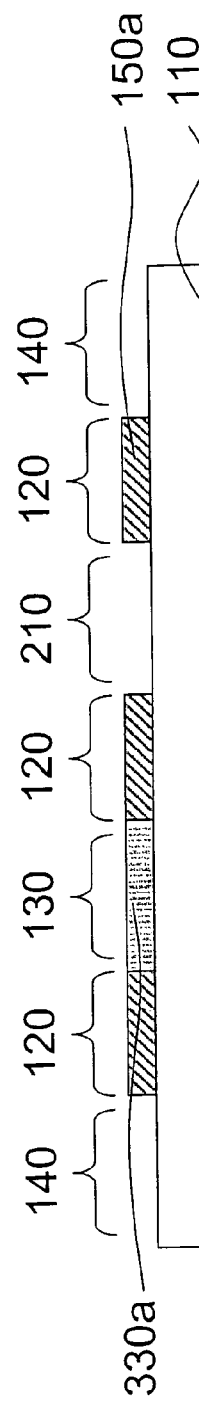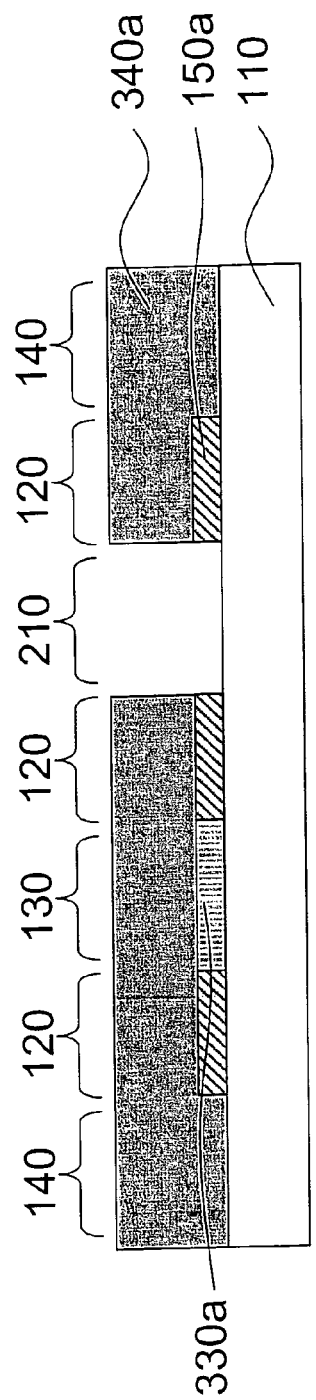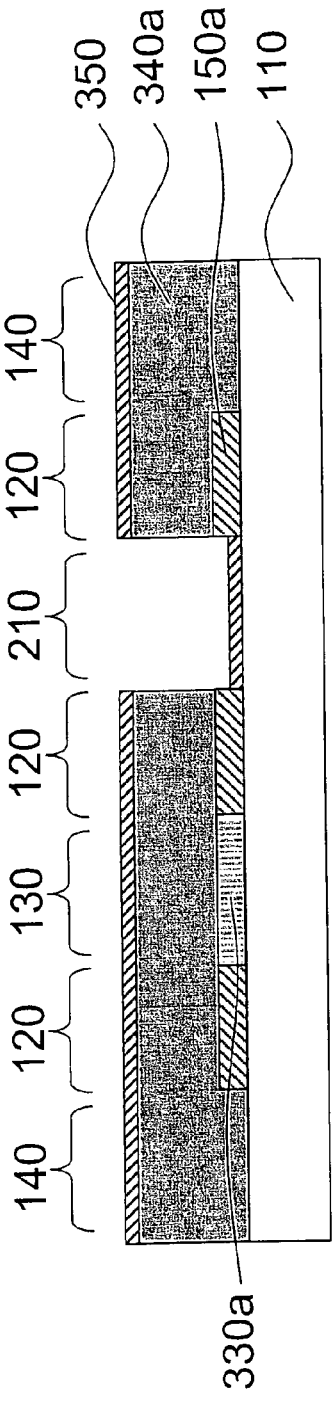

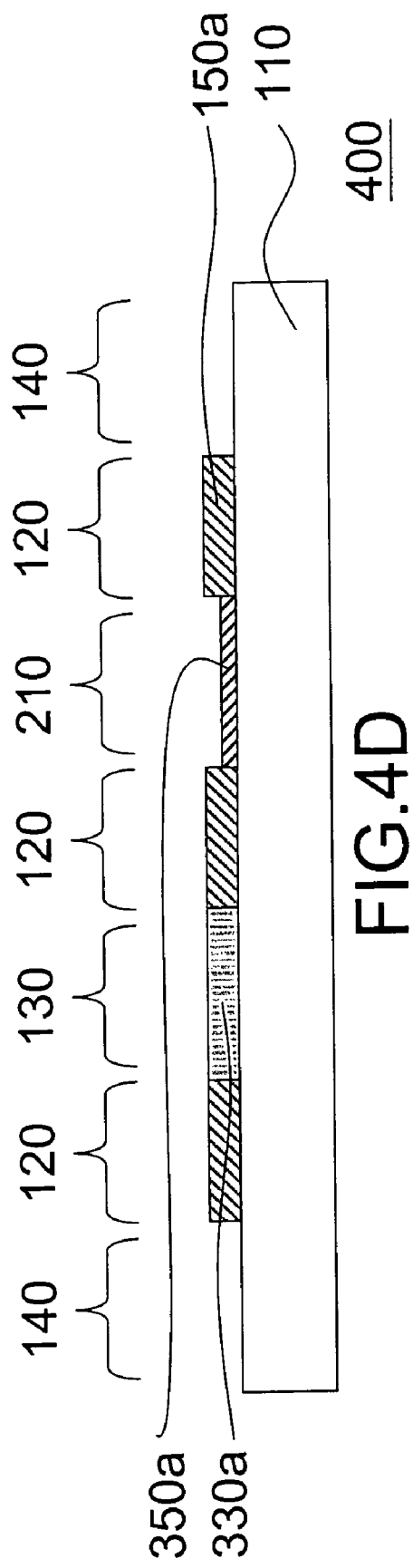

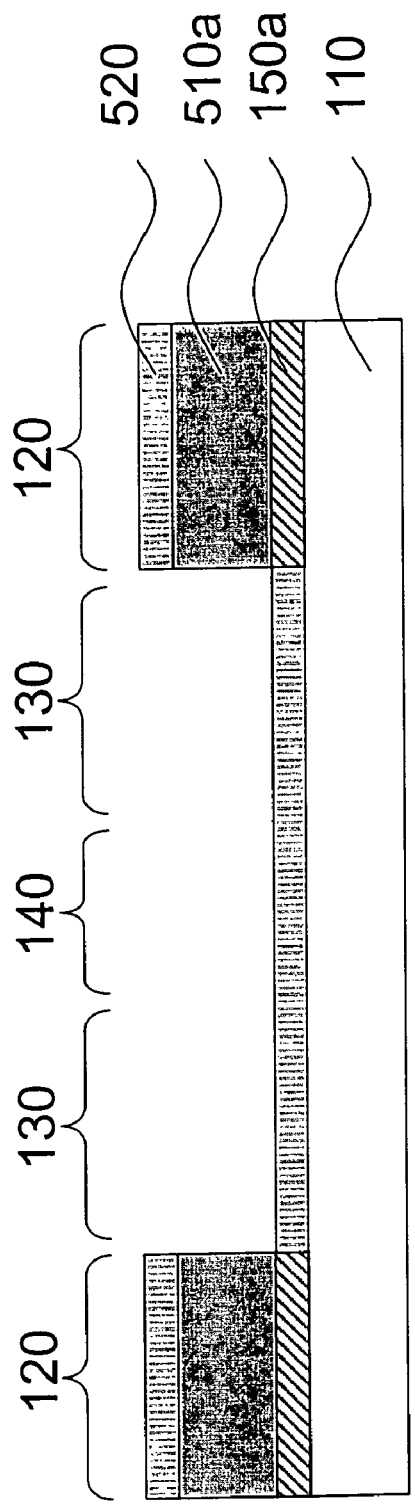
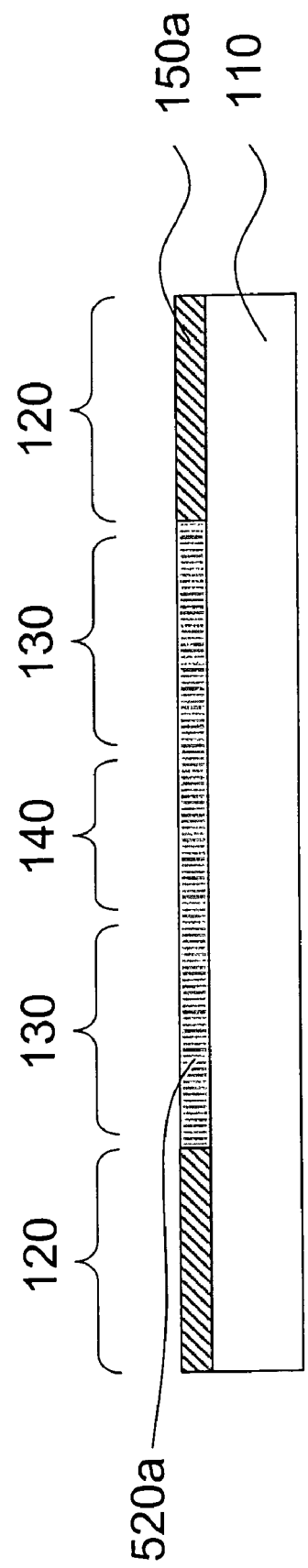
FIG.5D
FIG.5E

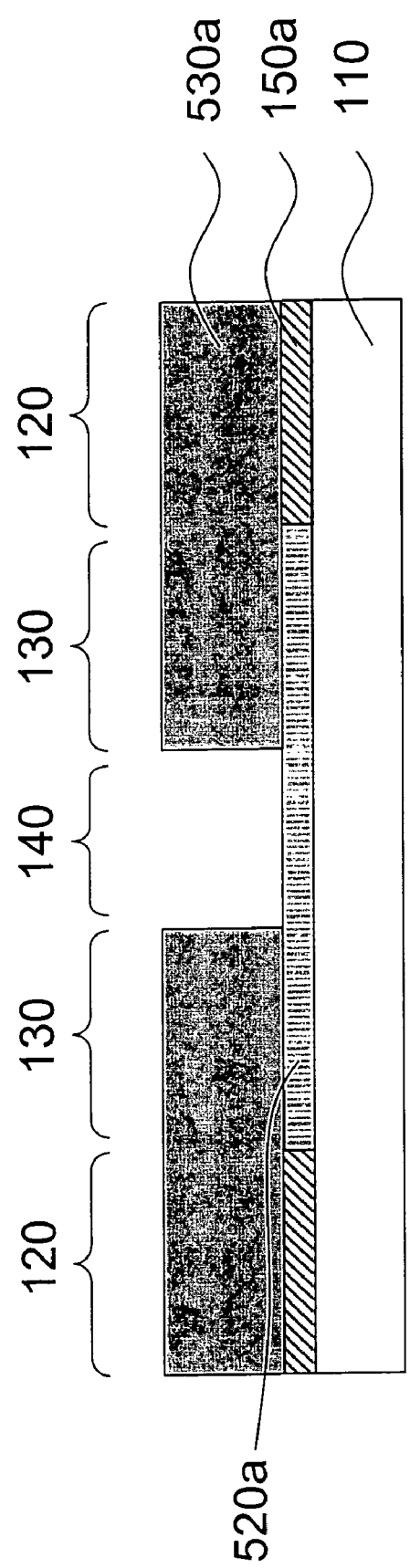
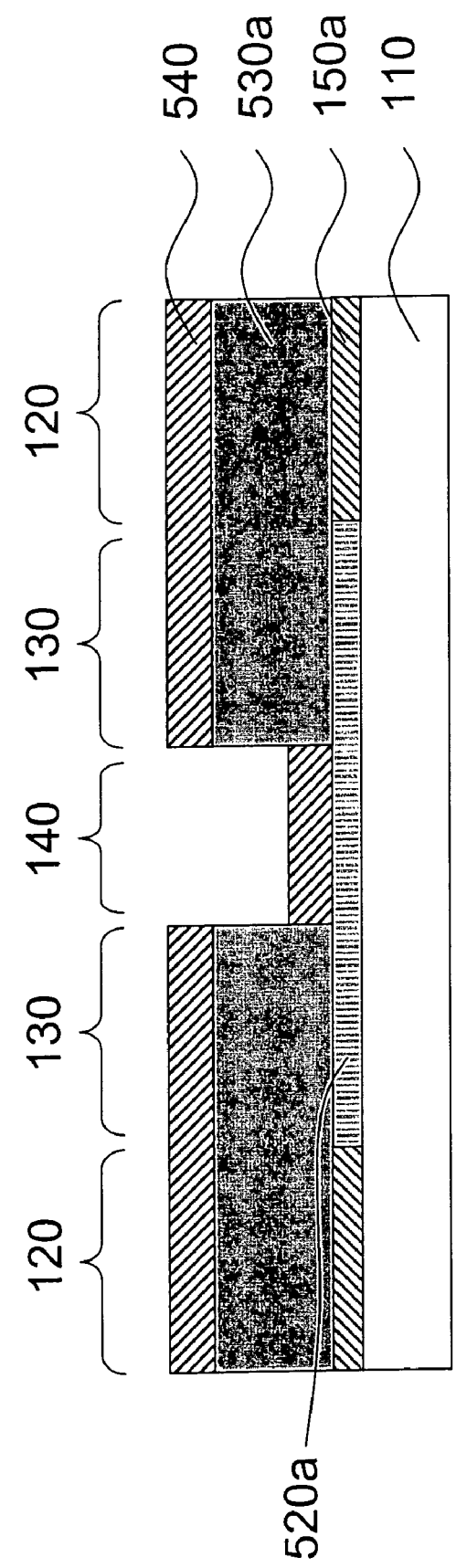
FIG.5F
FIG.5G

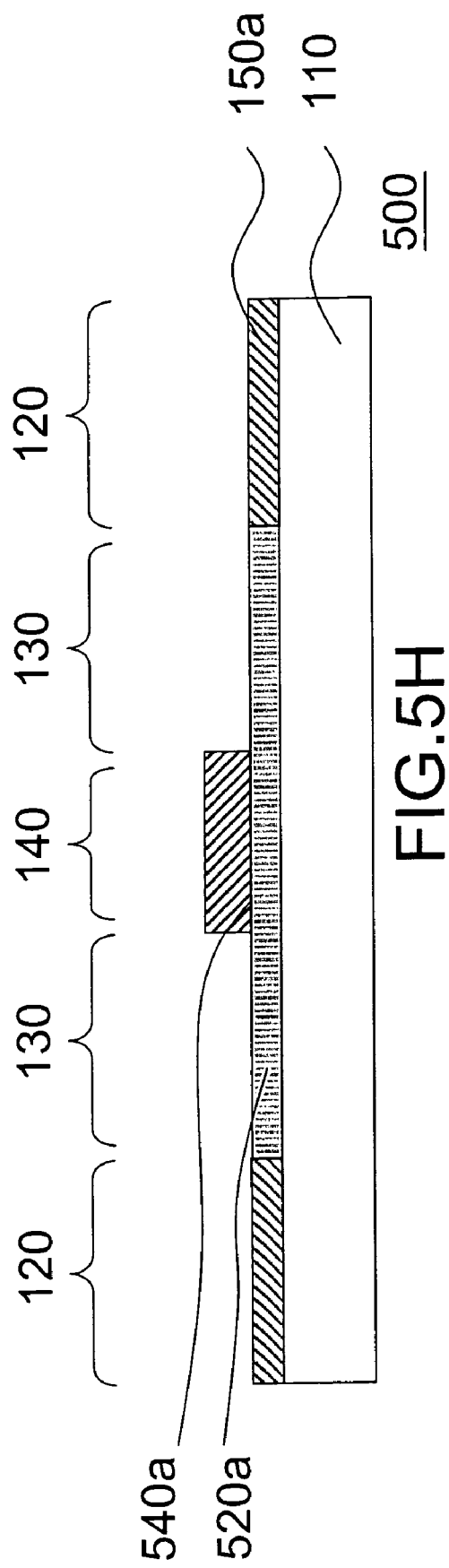

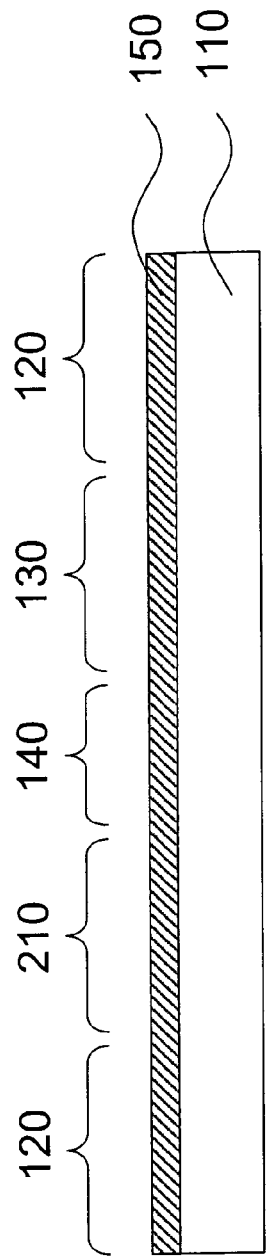
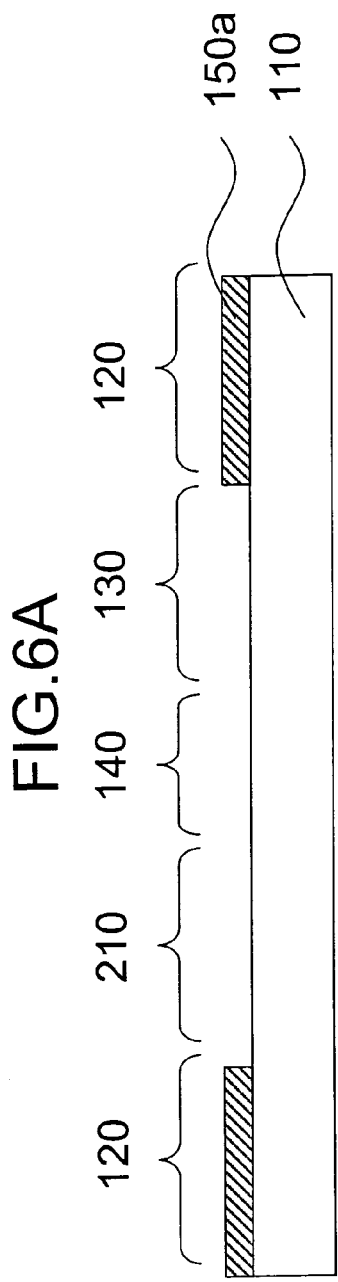
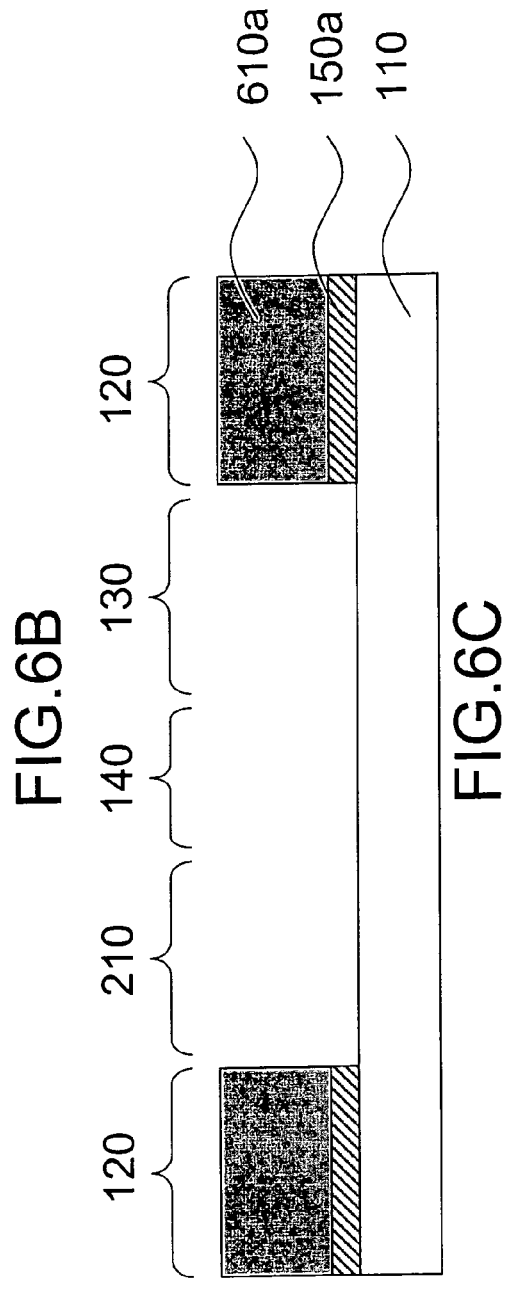

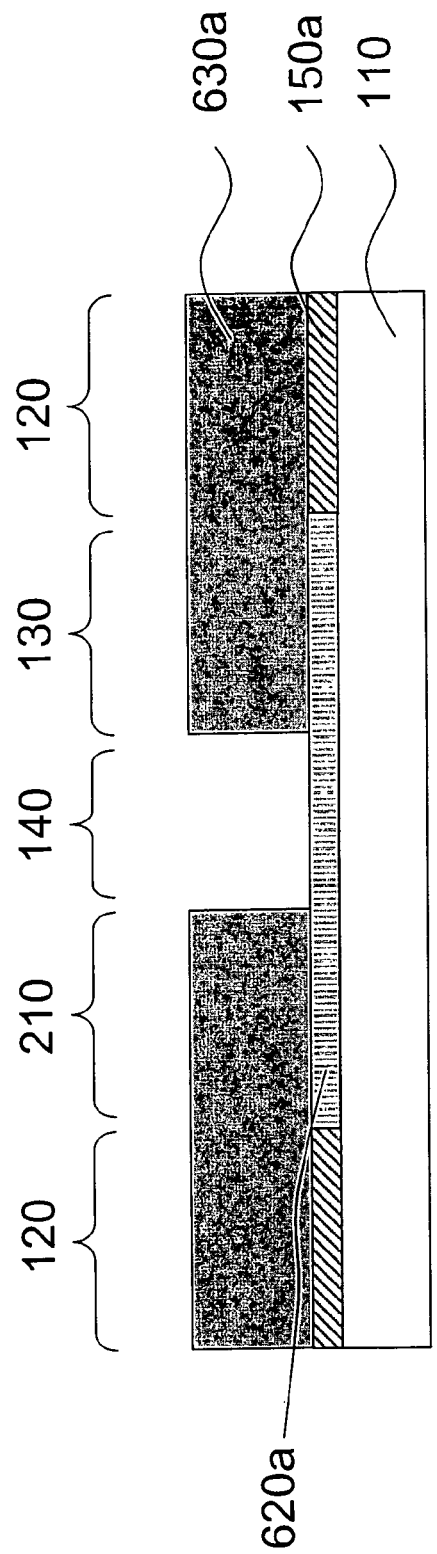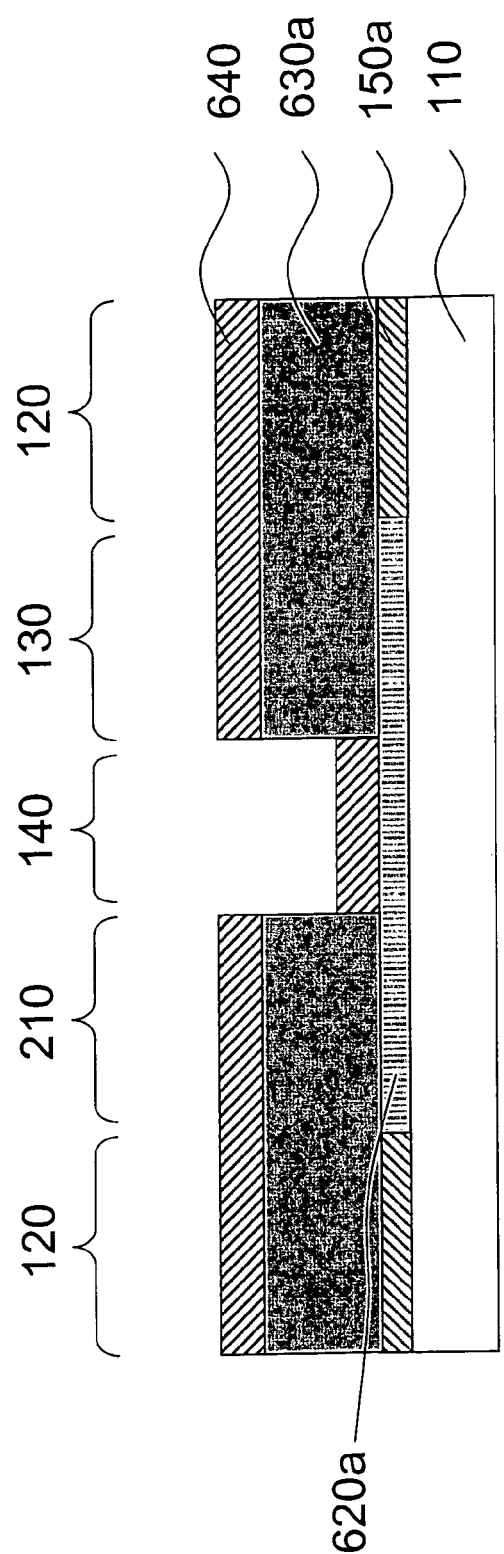

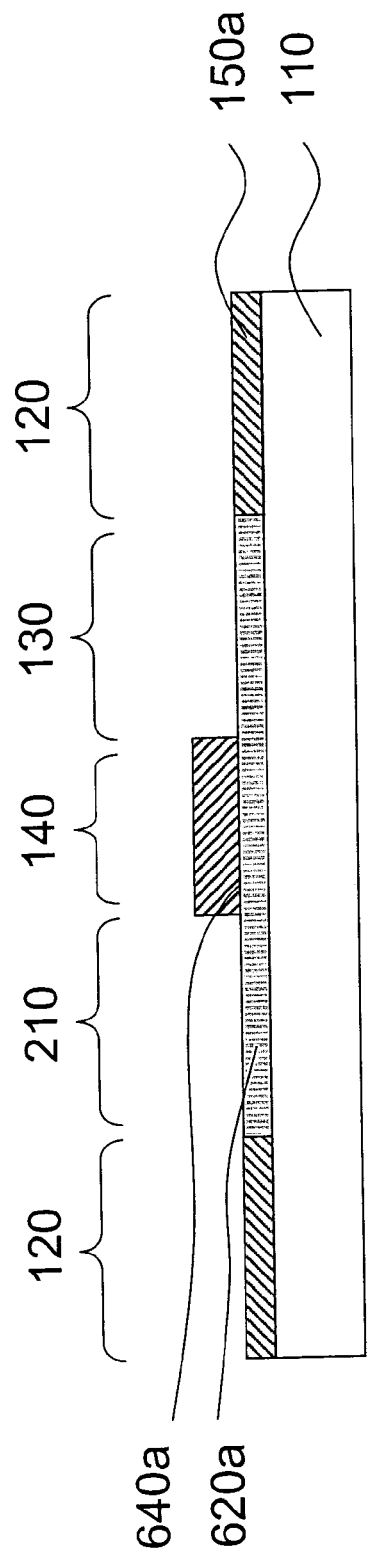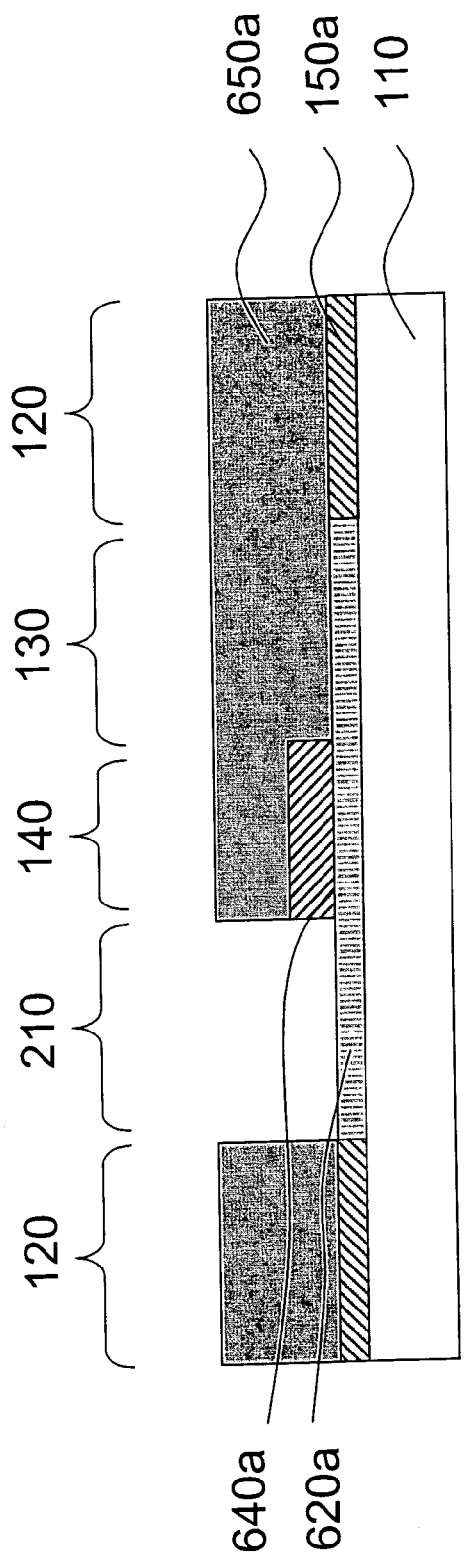

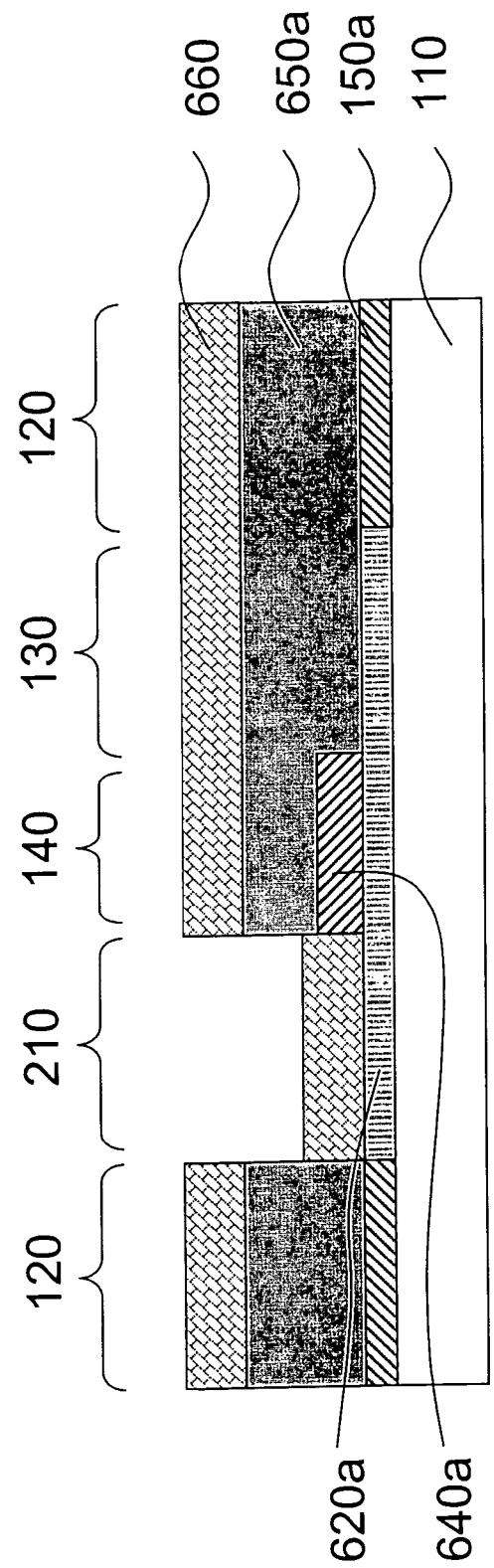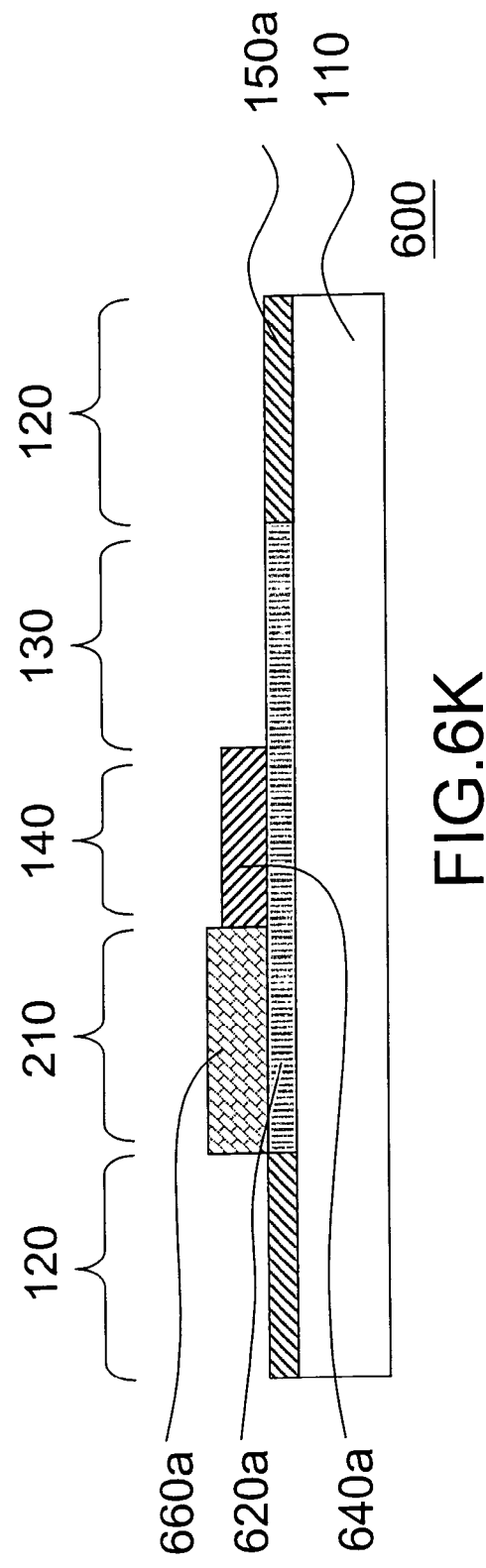

MASK AND MANUFACTURING METHOD THEREOF

CROSS-REFERENCE TO RELATED APPLICATION

This application claims the priority benefit of Taiwan application serial no. 94131047, filed on Sep. 9, 2005. All disclosure of the Taiwan application is incorporated herein by reference.

BACKGROUND OF THE INVENTION

1. Field of Invention

The present invention relates to a mask and a manufacturing method thereof. More particularly, the present invention relates to a phase shift (halftone) mask (PSM) and a manufacturing method thereof.

2. Description of Related Art

Generally, the manufacturing process of a conventional mask includes the following steps. First, a quartz substrate whereon a metal layer has been formed is provided. A photoresist layer is formed on the quartz substrate and the metal layer, and by exposing and developing in certain areas, part of the photoresist layer is removed to expose the metal layer thereunder. Next, the exposed metal layer is removed through a dry etching process or wet etching process. Thus, non-transmitting and transmitting patterns are formed on the quartz substrate after the photoresist layer is removed completely. Finally, a transparent pellicle is formed over the substrate, so a binary mask is completed.

Even though the binary mask is widely used in the industry, but slit type mask is generally used upon the reduction of the devices manufacture process. But slit type mask will bring in diffraction effect, which may affect the exposure evenness of the photoresist. Accordingly, there will be unnecessary pattern residue after etching.

A phase shift (halftone) mask can resolve both low accuracy and uneven exposure problems. However, the general manufacturing method for phase shift (halftone) mask is identical to the method for manufacturing a binary mask. First a binary mask is manufactured. After that, a phase shift (halftone) thin film is formed on the binary mask, then a photoresist layer is formed on the mask and the phase shift (halftone) thin film, and then by exposing and developing in certain areas, part of the photoresist layer is removed to expose the phase shift (halftone) thin film thereunder. After that, the exposed phase shift (halftone) thin film is removed through a dry etching process or wet etching process. After the photoresist layer is completely removed, a transparent pellicle is formed, thus a phase shift (halftone) mask is finished. Note that the transmittance of phase shift (halftone) thin film depends on the film material, film thickness, and phase angle.

Even though the phase shift (halftone) mask can resolve the problems of low accuracy and uneven exposure, as etching technology is used in the manufacturing method thereof, when uneven etching occurs on the phase shift (halftone) thin film, the thickness of the phase shift (halftone) thin film on the mask will be uneven. Accordingly the transmittance or phase angles may be different after the light passes through the phase shift (halftone) thin film at different locations of the mask so as to lead to low yield in the lithography process.

Moreover, the manufacturing process of the phase shift (halftone) mask is as follows: forming a layer of phase shift (halftone) thin film on a binary mask after the binary mask is initially formed; performing a lithography process to define the pattern of the phase shift (halftone) thin film; then transferring the pattern to the phase shift (halftone) thin film through an etching process; finally removing the photoresist completely. Compared to the conventional binary mask, there may be more defects when manufacturing the mask due to the complicated manufacturing procedure. Accordingly, the manufacturing cost thereof may be increased.

SUMMARY OF THE INVENTION

Accordingly, the present invention is directed to a mask manufacturing method, wherein the phase shift (halftone) layer is fabricated through a lift-off process to avoid uneven thin film thickness due to an etching process.

The present invention is also directed to a mask manufacturing method capable of reducing the manufacturing cost of the phase shift (halftone) mask.

According to yet another aspect of the present invention, a mask is provided, wherein the mask has never appeared in the conventional mask.

The present invention provides a mask manufacturing method, including the following steps. First, a transparent substrate having a first region, a second region, and a third region is provided. Then, a non-transmitting layer is formed in the first region of the transparent substrate. After that, a first photoresist layer is formed on the transparent substrate and exposes the second region of the transparent substrate. Next, a first transmitting layer is formed on the transparent substrate and the first photoresist layer. The first photoresist layer is removed, wherein the first transmitting layer located on the first photoresist layer is removed at the same time, the first transmitting layer formed in the second region of the transparent substrate is remained, and the third region of the transparent substrate is exposed.

According to an embodiment of the present invention, the transparent substrate further includes a fourth region, and after the step of removing the first photoresist layer, the method further includes the following steps. A second photoresist layer is formed on the transparent substrate and exposes the fourth region of the transparent substrate. A second transmitting layer is formed on the transparent substrate and the second photoresist layer. The second photoresist layer is removed, wherein the second transmitting layer located on the second photoresist layer is removed at the same time and the second transmitting layer formed in the fourth region of the transparent substrate is remained. In an embodiment, the material of the first transmitting layer is different from that of the second transmitting layer. In another embodiment, the thickness of the first transmitting layer is different from the thickness of the second transmitting layer. In yet another embodiment, both the material and the thickness of the first transmitting layer are different from those of the second transmitting layer.

According to an embodiment of the present invention, the first transmitting layer and the second transmitting layer described above are phase shift (halftone) thin films respectively. In addition, the phase shift (halftone) thin film comprises, for example, metal silicide, metal fluoride, metal silicide oxide, metal silicide nitride, metal silicide oxynitride, metal silicide carbide oxide, metal silicide carbide nitride, metal silicide carbide oxynitride, alloy, thin metal film, carbide, carbon oxide, or a combination thereof.

The present invention also provides a method for remanufacturing a mask, which includes the following steps. First, a mask having a first region, a second region, and a third region is provided, wherein a non-transmitting layer has been formed in the first region, and the mask is covered by a pellicle. After the pellicle covering the mask is removed, a first photoresist layer is formed on the mask and exposes the second region of the transparent substrate. After that, a first transmitting layer is formed on the transparent substrate and the first photoresist layer. The first photoresist layer is removed, wherein the first transmitting layer located on the first photoresist layer is removed at the same time, the first transmitting layer formed in the second region of the transparent substrate is remained and the third region of the transparent substrate is exposed.

According to an embodiment of the present invention, the mask further includes a fourth region, and after the step of removing the first photoresist layer, a second photoresist layer is formed on the mask and exposes the fourth region of the mask. After that, a second transmitting layer is formed on the mask and the second photoresist layer. The second photoresist layer is removed, wherein the second transmitting layer located on the second photoresist layer is removed at the same time and the second transmitting layer formed in the fourth region of the mask is remained. In an embodiment, the material of the first transmitting layer is different from that of the second transmitting layer. In another embodiment, the thickness of the first transmitting layer is different from that of the second transmitting layer. In yet another embodiment, both the material and the thickness of the first transmitting layer are different from those of the second transmitting layer.

The present invention provides another mask manufacturing method, which includes the following steps. First, a transparent substrate having a first region, a second region, and a third region is provided. A non-transmitting layer is formed in the first region of the transparent substrate. A first photoresist layer is formed on the transparent substrate and exposes the second region and the third region of the transparent substrate. A first transmitting layer is formed on the transparent substrate and the first photoresist layer. The first photoresist layer is removed, wherein the first transmitting layer located on the first photoresist layer is removed at the same time, the first transmitting layer formed in the second and the third regions of the transparent substrate is remained. A second photoresist layer is formed on the transparent substrate, which covers the non-transmitting layer and the first transmitting layer in the second region and exposes the first transmitting layer in the third region. After that, a second transmitting layer is formed on the second photoresist layer to cover the exposed first transmitting layer. The second photoresist layer is removed, wherein the second transmitting layer located on the second photoresist layer is removed at the same time and the second transmitting layer formed on the first transmitting layer in the third region is remained. In an embodiment, the material of the first transmitting layer is different from that of the second transmitting layer. In another embodiment, the thickness of the first transmitting layer is different from that of the second transmitting layer. In yet another embodiment, both the material and the thickness of the first transmitting layer are different from those of the second transmitting layer.

According to an embodiment of the present invention, the aforementioned transparent substrate further includes a fourth region, and in the step of forming the first photoresist layer, the transparent substrate in the fourth region is exposed. In addition, after the step of removing the first photoresist layer, the first transmitting layer is remained in the fourth region. In the step of forming the second photoresist layer, the fourth region is covered. After the step of removing the second photoresist layer, the first transmitting layer in the fourth region is exposed. Subsequently, a third photoresist layer is formed on the transparent substrate and exposes the first transmitting layer in the fourth region. Next, a third transmitting layer is formed on the third photoresist layer to cover the first transmitting layer in the fourth region. After that, the third photoresist layer is removed, wherein the third transmitting layer located on the third photoresist layer is removed at the same time and the third transmitting layer formed on the first transmitting layer in the fourth region is remained.

The present invention further provides a mask including a transparent substrate, a non-transmitting layer, a first transmitting layer, and a second transmitting layer. The transparent substrate includes at least a first region, a second region, and a third region, the non-transmitting layer is located in the first region of the transparent substrate, the first transmitting layer is located in the second region of the transparent substrate, and the second transmitting layer is located in the third region of the transparent substrate. In particular, the second region is adjacent to the third region, such that the first transmitting layer is adjacent to the second transmitting layer.

In an embodiment, the thickness of the first transmitting layer is different from that of the second transmitting layer. In another embodiment, the material of the first transmitting layer is different from that of the second transmitting layer. In yet another embodiment, both the material and the thickness of the first transmitting layer are different from those of the second transmitting layer.

As described above, compared to the conventional technology, the present invention can avoid uneven thickness induced by an etching process by using a lift-off process in the manufacturing process of transmitting layers. Moreover, according to the present invention, halftone patterns of various transmittance can be formed on the mask by forming transmitting layers of different thicknesses, or different materials, or both different thicknesses and different materials. If the phase shift (halftone) thin film is used in the transmitting layers, then the mask formed is halftone phase shift (halftone) mask, which has the advantages of simpler manufacturing process and lower manufacturing cost compared to the conventional phase shift (halftone) mask.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A to 1F are cross-section views illustrating a mask manufacturing method according to the first embodiment of the present invention.

FIGS. 2A to 2E are cross-section views illustrating another mask manufacturing method according to the first embodiment of the present invention.

FIGS. 4A to 4D are cross-section views illustrating another mask manufacturing method according to the second embodiment of the present invention.

FIGS. 5A to 5H are cross-section views illustrating a mask manufacturing method according to the third embodiment of the present invention.

FIGS. 6A to 6K are cross-section views illustrating another mask manufacturing method according to the third embodiment of the present invention.

DESCRIPTION OF EMBODIMENTS

Figure 1D:
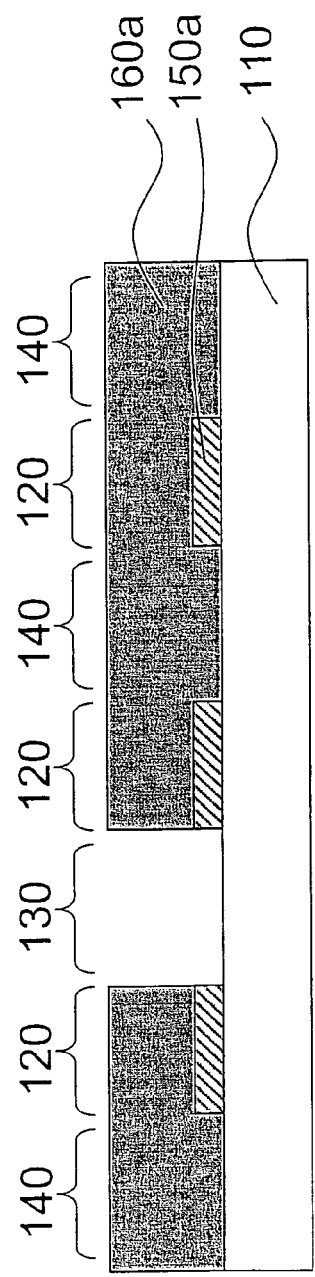

FIGS. 1A to 1F are cross-section views illustrating a mask manufacturing method according to the first embodiment of the present invention. The mask manufacturing method of the present embodiment includes the following steps. Referring to FIG. 1A, first, a transparent substrate 110 having a first region 120, a second region 130, and a third region 140 is provided. The transparent substrate 110 is, for example, a quartz substrate or transparent substrate of other materials. Then, a non-transmitting layer 150 is formed on the substrate, which is, for example, chromium film of 700 to 2000 angstroms in thickness combined with chromium oxide film of 100 to 300 angstroms in thickness, preferably chromium film of 800 to 1200 angstroms in thickness combined with chromium oxide film of 100 to 200 angstroms in thickness. Other materials which can be used in the non-transmitting layer 150 are carbide, carbon oxide, or stable black resin.

Referring to FIG. 1B, a patterning process is performed to the non-transmitting layer 150 to form a non-transmitting layer 150a. The patterning process includes a lithography process and etching process, wherein the lithography process is, for example, by defining photoresist with laser or e-beam, and the etching process is, for example, a dry etching or wet etching process.

Referring to FIG. 1C, a first photoresist layer 160 is coated over the entire substrate. Next, a lithography process is performed to the first photoresist layer 160 to form a first photoresist layer 160a, which exposes the second region 130 of the transparent substrate 110, as shown in FIG. 1D. The lithography process is, for example, to expose with laser or e-beam. The corresponding device areas of the exposed second region 130 are, for example, channel region of TFT, Cs contact region of auxiliary capacitor, reflective region of transflective type or reflective type LCD, organic layer of multi cell gap, photo spacer, multi domain vertical alignment (MVA), protrusion of color filter, critical layer of semiconductor which needs high resolution, for example, a gate layer, contact layer, or other layers.

Figure 1E:
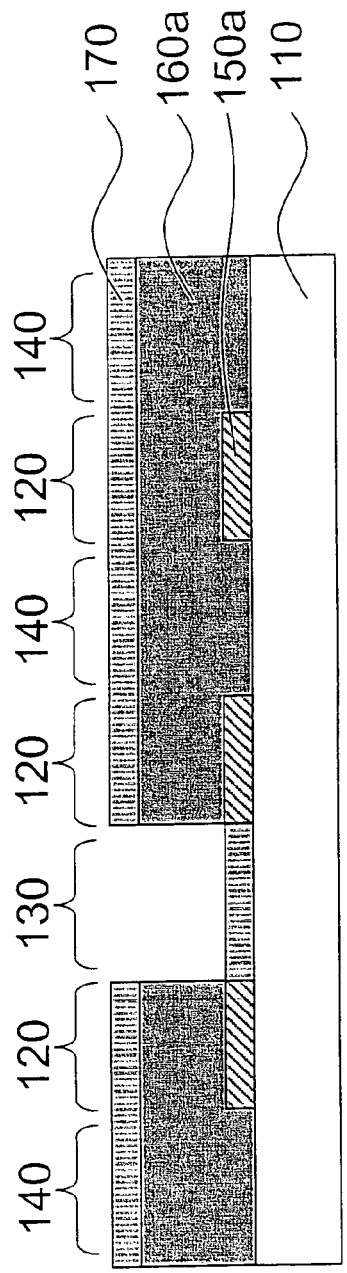

Referring to FIG. 1E, next, a first transmitting layer 170 is formed on the substrate 110 and the first photoresist layer 160a, wherein the formation method is, for example, a low temperature collimated sputtering or chemical vapor deposition process with field screen. Here, the first transmitting layer 170 has higher transmittance relative to the non-transmitting layer 150. In an embodiment, the material of the first transmitting layer 170 is, for example, a phase shift (halftone) thin film, the material of the phase shift (halftone) thin film comprises, for example, metal silicide, metal fluoride, metal silicide oxide, metal silicide nitride, metal silicide oxynitride, metal silicide carbide oxide, metal silicide carbide nitride, metal silicide carbide oxynitride, alloy, thin metal film, carbide, carbon oxide, or the combinations thereof, wherein the metals which can be combined include, for example, molybdenum, tantalum, zirconium, chromium, and tungsten etc.

Figure 1F:
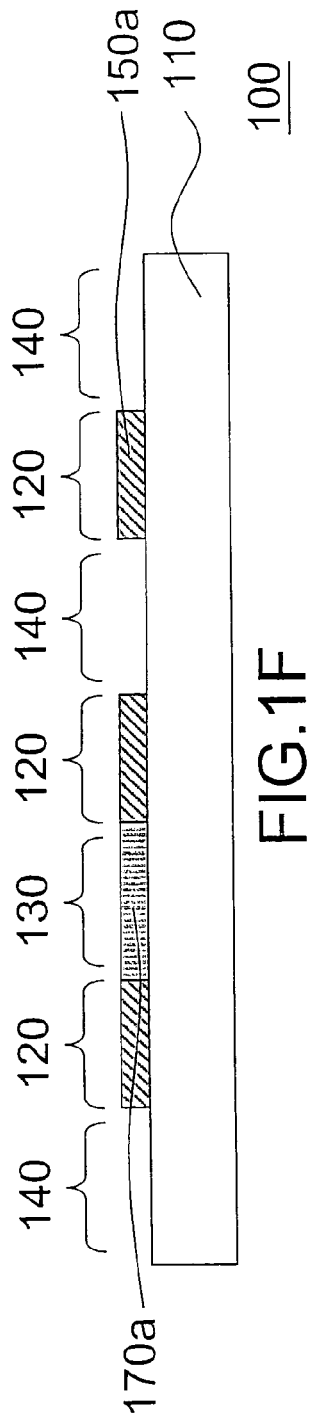

Referring to FIG. 1F, a lift-off process is performed to remove the first photoresist layer 160a. Meanwhile, the first transmitting layer 170 located on the photoresist layer 160a is removed together, the first transmitting layer 170a in the second region 130 is remained and the third region 140 of the transparent substrate 110 is exposed. A halftone mask 100 having transmitting pattern, non-transmitting pattern, and halftone pattern is completed through the aforementioned process. If phase shift (halftone) thin film is used in the first transmitting layer 170, then the completed mask is halftone phase shift mask (HTPSM).

FIGS. 2A to 2E are cross-section views illustrating another mask manufacturing method according to the first embodiment of the present invention, which is modified from the mask manufacturing method shown in FIGS. 1A to 1F. Referring to FIG. 2A, the halftone mask 102 in FIG. 2A includes a transparent substrate 110, a non-transmitting layer 150a, and a first transmitting layer 170a, wherein the transparent substrate 110 includes a first region 120, a second region 130, a third region 140, and a fourth region 210. The non-transmitting layer 150a is located in the first region 120, and the first transmitting layer 170a is located in the second region 130. The non-transmitting layer 150a and the first transmitting layer 170a are the same as or similar to those described in the aforementioned embodiment so are not explained again.

Referring to FIG. 2B, a second photoresist layer 220 is coated over the transparent substrate 110. Next a lithography process is performed to the second photoresist layer 220 to form a second photoresist layer 220a, which exposes the fourth region 210 of the transparent substrate 110, as shown in FIG. 2C. The lithography process is the same as or similar to the one described in the aforementioned embodiment, and the corresponding device area of the exposed fourth region 210 is one of those device areas mentioned above.

Referring to FIG. 2D, next, a second transmitting layer 230 is formed on the transparent substrate 110 and the second photoresist layer 220. Here, the second transmitting layer 230 has higher transmittance relative to the non-transmitting layer 150a, and the transmittance of the first transmitting layer 170 is different from the transmittance of the second transmitting layer 230. In an embodiment, the thickness of the first transmitting layer 170 is different from that of the second transmitting layer 230. In another embodiment, the material of the first transmitting layer 170 is different from that of the second transmitting layer 230. In yet another embodiment, both the material and the thickness of the first transmitting layer 170 are different from those of the second transmitting layer 230. The material of the second transmitting layer 230 is, for example, a phase shift (halftone) thin film.

Next, a lift-off process is performed to remove the second photoresist layer 220a. Meanwhile, the second transmitting layer 230 on the second photoresist layer 220a is removed together and the second transmitting layer 230a in the fourth region 210 is removed, as shown in FIG. 2E. Thus the manufacturing process of the multi-tone mask 200 is completed. If the phase shift (halftone) thin film is used in the aforementioned first transmitting layer 170 and second transmitting layer 230, then the completed mask 200 is multi-tone phase shift (halftone) mask (MTPSM).

Note that to have the best result, the thicknesses of the photoresist and the phase shift (halftone) thin film are controlled to avoid peeling when the lift off process is performed in the present embodiment. This requirement can be met by coating thicker photoresist and using a low temperature collimated sputtering process, or by using a chemical vapor deposition process with field screen. Moreover, increasing developer temperature and adding in vibration, for example, mega sonic vibration, when exposing can remove the thin film on the photoresist completely, and pollution can be prevented by the changing and controlling of developer.

FIGS. 3A to 3F are cross-section views illustrating a mask manufacturing method according to the second embodiment of the present invention, which includes the following steps.

Figure 3A:
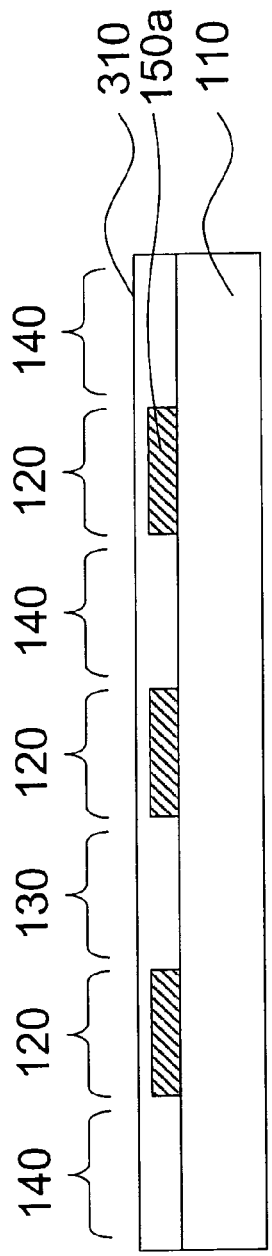
FIGS. 3A to 3F are cross-section views illustrating a mask manufacturing method according to the second embodiment of the present invention.

Referring to FIG. 3A, first, a recycled mask having a transparent substrate 110, a non-transmitting layer 150a, and a pellicle 310 is provided. The transparent substrate 110 includes a first region 120, a second region 130, and a third region 140, and the non-transmitting layer 150a is located in the first region 120.

Figure 3B:
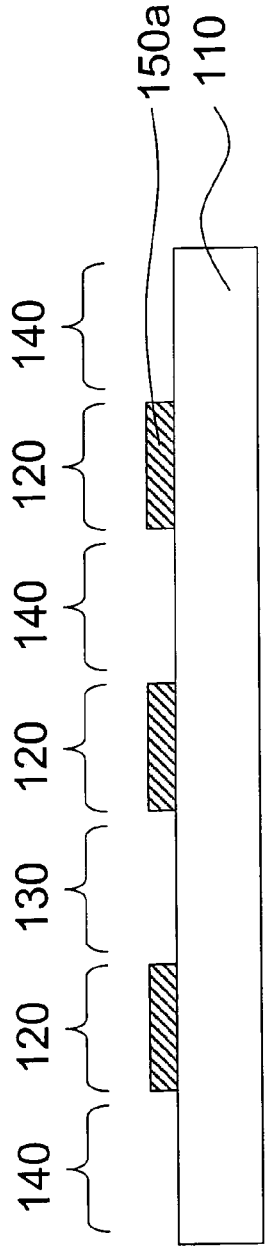

Referring to FIG. 3B, the pellicle 310 is removed to expose the non-transmitting layer 150a and the transparent substrate 110 covered by the pellicle 310.

Figure 3C:
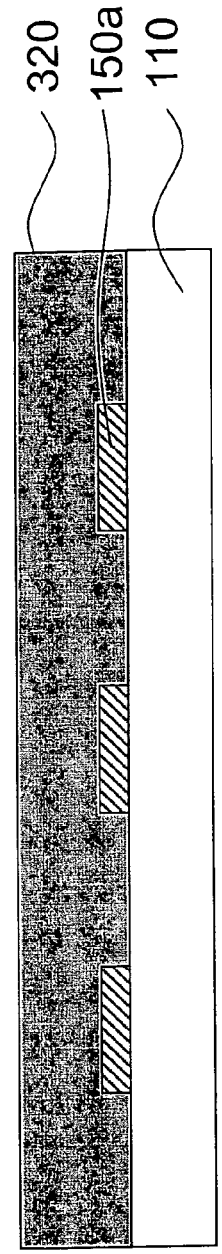
Figure 3D:
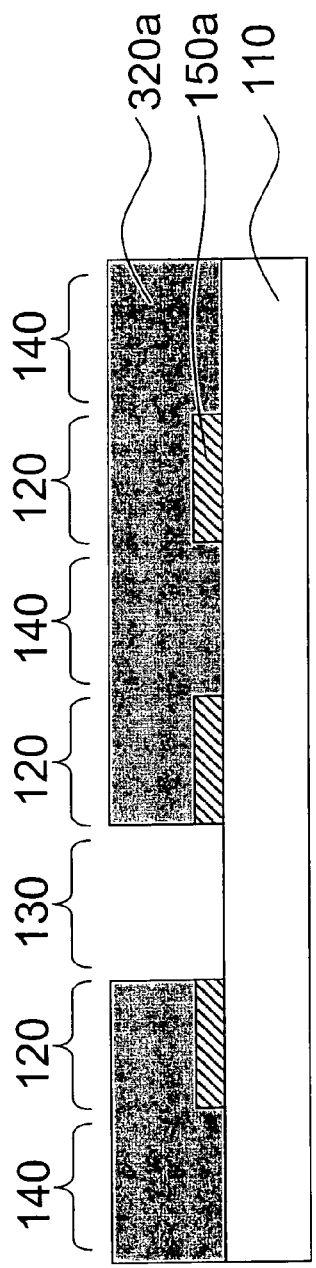

Referring to FIG. 3C, a first photoresist layer 320 is coated over the entire substrate 110. Next, a lithography process is performed to the first photoresist layer 320 to form the first photoresist layer 320a, as shown in FIG. 3D, to expose the transparent substrate 110 in the second region 130.

Figure 3E:
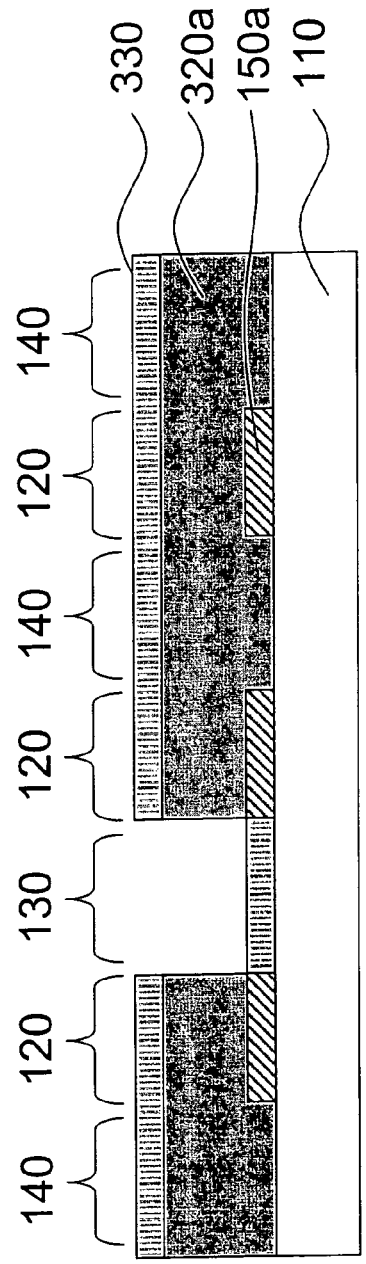

Referring to FIG. 3E, next, a first transmitting layer 330 is formed on the transparent substrate 110 and the first photoresist layer 320a. The fabricating method and material used are the same as or similar to those of the first transmitting layer 170 described in the first embodiment.

Figure 3F:
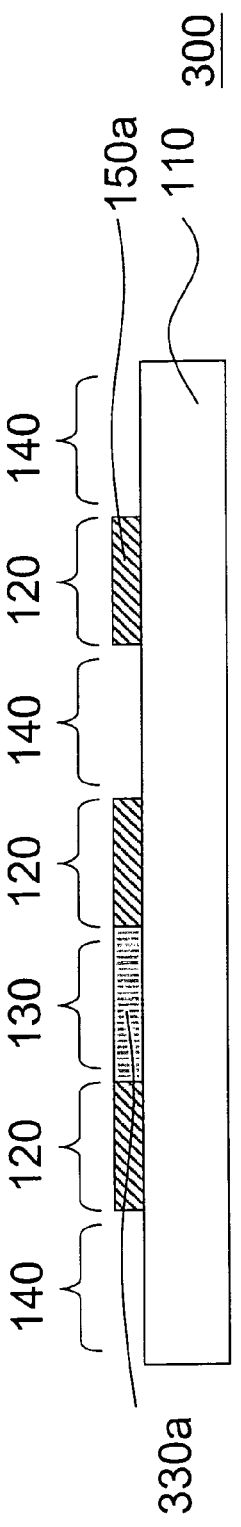

After that, a lift-off process is performed to remove the first photoresist layer 320a, and the first transmitting layer 330 located on the photoresist layer 320a is removed together, and the first transmitting layer 330a in the second region 130 is remained, as shown in FIG. 3F. Thus a halftone mask 300 is completed. Similarly, if phase shift (halftone) thin film is used in the first transmitting layer 330, then the completed mask is halftone phase shift (halftone) mask.

FIGS. 4A to 4D are cross-section views illustrating another mask manufacturing method according to the second embodiment of the present invention, which is modified from the mask manufacturing method illustrated in FIG. 3A to 3F. Referring to FIG. 4A, the halftone mask 302 includes a transparent substrate 110, a non-transmitting layer 150a, and a transmitting layer 330a. The transparent substrate 110 includes a first region 120, a second region 130, a third region 140, and a fourth region 210. The non-transmitting layer 150a is located in the first region 120, and the first transmitting layer 330a is located in the second region 130.

Referring to FIG. 4B, a second photoresist layer (not shown) is coated over the transparent substrate 110. After that, a lithography process is performed to the second photoresist layer to form the second photoresist layer 340a, which exposes the transparent substrate 110 in the fourth region 210.

Referring to FIG. 4C, next, a second transmitting layer 350 is formed on the transparent substrate 110 and the second photoresist layer 340a. The fabricating method and material used are the same as or similar to those of the first transmitting layer 170 described in the first embodiment. In an embodiment, the thickness of the first transmitting layer 330 is different from the thickness of the second transmitting layer 350. In another embodiment, the material of the first transmitting layer 330 is different from the material of the second transmitting layer 350. In yet another embodiment, both the material and the thickness of the first transmitting layer 330 are different from those of the second transmitting layer 350.

Next, a lift-off process is performed to remove the second photoresist layer 340a. The second transmitting layer 350 located on the second photoresist layer 340a is removed at the same time and the second transmitting layer 350a in the fourth region 210 is remained, as shown in FIG. 4D. So a multi-tone mask 400 is completed through the process described above. Similarly, if phase shift (halftone) thin film is used in the first transmitting layer 330 and the second transmitting layer 350, then the completed mask is multi-tone phase shift (halftone) mask.

By using this embodiment, those masks which have been used on the production line can be recycled and reprocessed, so that cost can be reduced considerably, and the five mask manufacturing processes in the array manufacturing of TFT LCD can be combined into four or three processes. Accordingly, the manufacturing cost of large size mask can be reduced and the production capacity of photolithography can be increased.

Figure 5A:
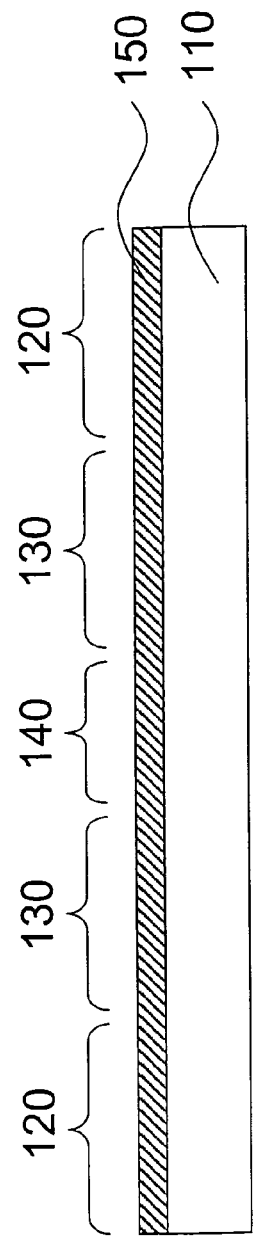

FIGS. 5A to 5H are cross-section views illustrating a mask manufacturing method according to the third embodiment of the present invention, which includes the following steps. Referring to FIG. 5A, first, a transparent substrate 110 having a first region 120, a second region 130, and a third region 140 is provided. The transparent substrate 110 is, for example, a quartz substrate or transparent substrate of other materials. A non-transmitting layer 150 is then formed on the transparent substrate 110. The thickness and material of the non-transmitting layer 150 are the same as or similar to those described in the first embodiment.

Figure 5B:
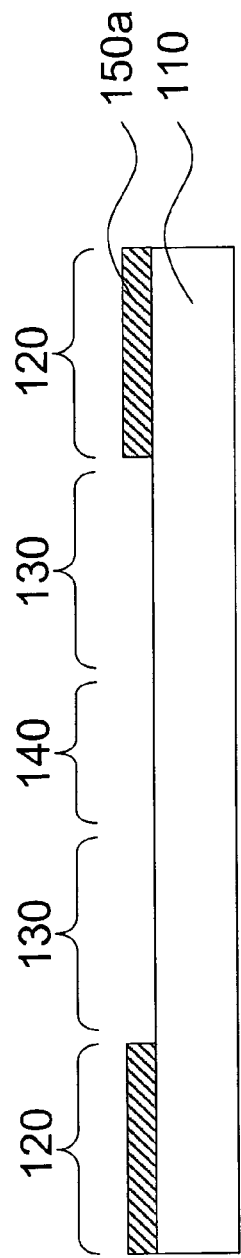

Referring to FIG. 5B, a patterning process is performed to the non-transmitting layer 150 to form a non-transmitting layer 150a. The patterning process is, for example, a lithography process or etching process, and the lithography process is, for example, by defining the photoresist with laser or e-beam, and the etching process is, for example, a dry etching or wet etching process.

Figure 5C:
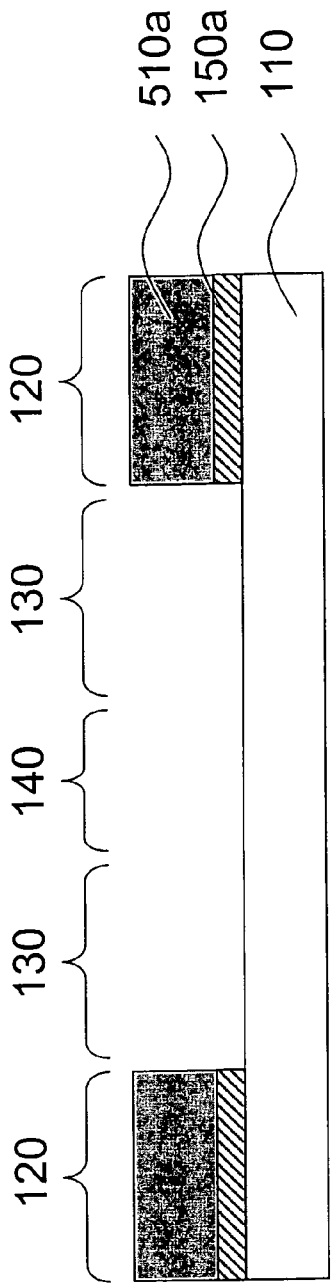

Referring to FIG. 5C, next, a first photoresist layer (not shown) is coated over the entire substrate 110. After that a lithography process is performed to the first photoresist layer to form a first photoresist layer 510a, which exposes the second region 130 and the third region 140 of the transparent substrate 110. The lithography process is the same as, for example, the one described in the first embodiment, and the corresponding device area of the exposed two regions is one of those device areas described above.

Referring to FIG. 5D, next, a first transmitting layer 520 is formed on the transparent substrate 110 and the first photoresist layer 510a. The fabricating method and material used are the same as or similar to those of the first transmitting layer 170 described in the first embodiment.

A lift-off process is performed to remove the first photoresist layer 510a. The first transmitting layer 520 on the first photoresist layer 510a is removed at the same time and the first transmitting layer 520a in the second region 130 and the third region 140 is remained, as shown in FIG. 5E.

Next, referring to FIG. 5F, a second photoresist layer (not shown) is coated over the transparent substrate 110. Next a lithography process is performed to the second photoresist layer to form the second photoresist layer 530a, which exposes the first transmitting layer 520a in the third region 140 of the transparent substrate 110.

Referring to FIG. 5G, next, a second transmitting layer 540 is formed on the transparent substrate 110 and the second photoresist layer 530a. The fabricating method and material used are the same as or similar to those of the first transmitting layer 170 described in the first embodiment.

Next, a lift-off process is performed to remove the second photoresist layer 530a. The second transmitting layer 540 located on the second photoresist layer 530a is removed at the same time and the second transmitting layer 540a on the first transmitting layer 520a in the third region 140 is remained, as shown in FIG. 5H. In an embodiment, the thickness of the first transmitting layer 520 is different from that of the second transmitting layer 540. In another embodiment, the material of the first transmitting layer 520 is different from that of the second transmitting layer 540. In yet another embodiment, both the material and the thickness of the first transmitting layer 520 are different from those of the second transmitting layer 540. A multi-tone mask 500 is completed through the process described above. Similarly, if the phase shift (halftone) thin film is used in the first transmitting layer 520 and the second transmitting layer 540, then the completed mask is multi-tone phase shift (halftone) mask.

Figure 6D:
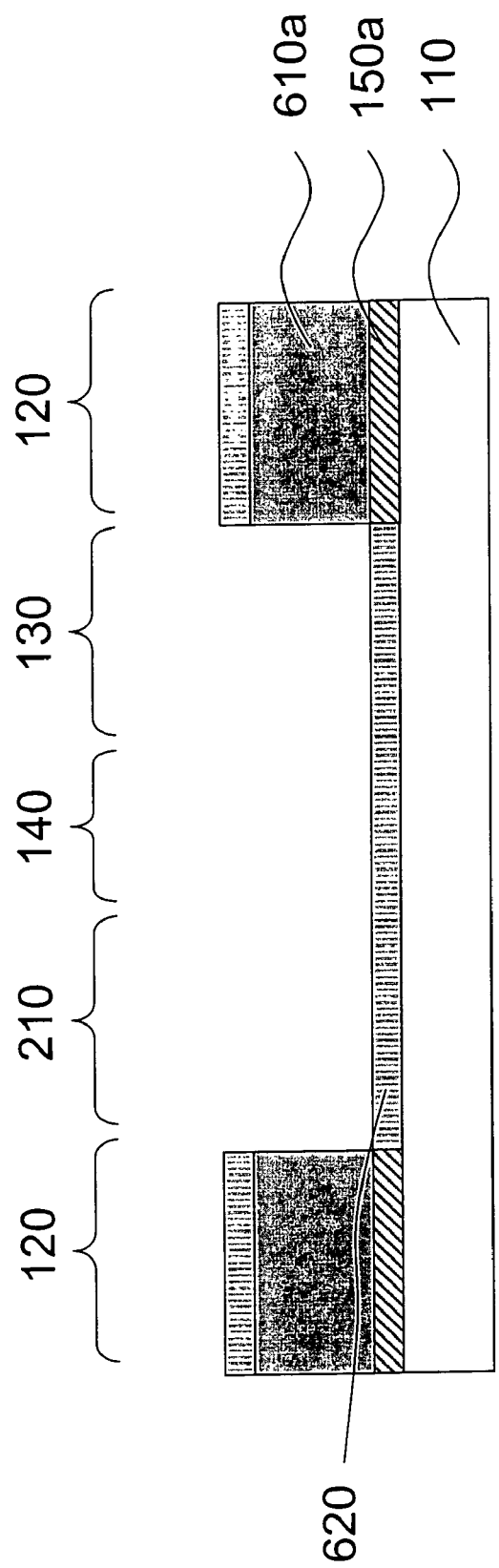

FIGS. 6A to 6K are cross-section views illustrating another mask manufacturing method according to the third embodiment of the present invention, which is modified from the mask manufacturing method illustrated in FIGS. 5A to 5H. Referring to FIG. 6A, a transparent substrate 110 having a first region 120, a second region 130, a third region 140, and a fourth region 210 is provided. Then, a non-transmitting layer 150 is formed on the transparent substrate 110.

Referring to FIG. 6B, a patterning process is performed to the non-transmitting layer 150 to form a non-transmitting layer 150a. The patterning process is, for example, a lithography process or etching process, wherein the lithography process is, for example, by defining the photoresist with laser or e-beam, and the etching process is, for example, a dry etching or wet etching process.

Referring to FIG. 6C, next, a first photoresist layer (not shown) is coated over the transparent substrate 110. Next, a lithography process is performed to the first photoresist layer to form a first photoresist layer 610a, which exposes the second region 130, the third region 140, and the fourth region 210 of the transparent substrate 110.

Referring to FIG. 6D, next, a first transmitting layer 620 is formed on the transparent substrate 110 and the first photoresist layer 610a. The fabricating method and material used are the same as those of the first transmitting layer 170 described in the first embodiment.

Figure 6E:

After that, a lift-off process is performed to remove the first photoresist layer 610a. The first transmitting layer 620 located on the first photoresist layer 610a is removed at the same time and the first transmitting layer 620a in the second region 130, the third region 140, and the fourth region 210 is remained, as shown in FIG. 6E.

Referring to FIG. 6F, next, a second photoresist layer (not shown) is coated over the transparent substrate 110. After that, a lithography process is performed to the second photoresist layer to form a second photoresist layer 630a, which exposes the first transmitting layer 620a in the third region 140 of the transparent substrate 110.

Referring to FIG. 6G, next, a second transmitting layer 640 is formed on the transparent substrate 110 and the second photoresist layer 630a. The fabricating method and material used are the same as or similar to those of the first transmitting layer 170 described in the first embodiment.

After that, a lift-off process is performed to remove the second photoresist layer 630a. The second transmitting layer 640 located on the second photoresist layer 630a is removed at the same time and the second transmitting layer 640a on the first transmitting layer 620a in the third region 140 is remained, as shown in FIG. 6H.

Referring to FIG. 6I, next, a third photoresist layer (not shown) is coated over the transparent substrate 110. After that, a lithography process is performed to the third photoresist layer to form a third photoresist layer 650a, which exposes the first transmitting layer 620a in the fourth region 210 of the transparent substrate 110.

Referring to FIG. 6J, next, a third transmitting layer 660 is formed on the transparent substrate 110 and the third photoresist layer 650a. The fabricating method and material used are the same as or similar to those of the first transmitting layer 170 described in the first embodiment.

After that, a lift-off process is performed to remove the third photoresist layer 650a. The second transmitting layer 660 located on the third photoresist layer 650a is removed at the same time and the third transmitting layer 660a on the first transmitting layer 620a in the fourth region 210 is remained, as shown in FIG. 6K. A multi-tone mask 600 is completed through the process described above. If a phase shift (halftone) thin film is used in the first transmitting layer 620, the second transmitting layer 640, and the third transmitting layer 660, then the completed mask is multi-tone phase shift (halftone) mask.

Figure 7:
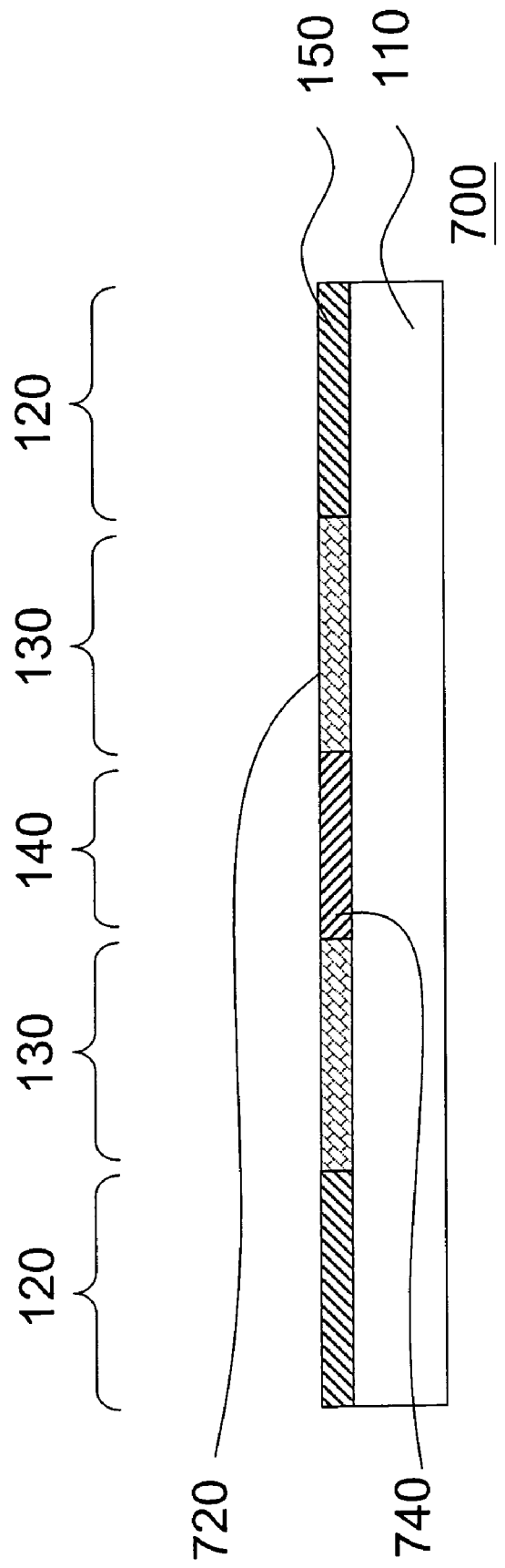
FIG. 7 is a cross-section view of a mask according to an embodiment of the present invention.

FIG. 7 is a cross-section view of a multi-tone mask manufactured according to the embodiments of the present invention described above. Referring to FIG. 7, the multi-tone mask 700 includes a transparent substrate 110, a non-transmitting layer 150, a first transmitting layer 720, and a second transmitting layer 740. The transparent substrate 110 includes a first region 120, a second region 130, and a third region 140. The non-transmitting layer 150 is located in the first region 120, the first transmitting layer 720 is located in the second region 130, and the second transmitting layer 740 is located in the third region 140. In particular, the second region 130 is adjacent to the third region 140 such that the first transmitting layer 720 is adjacent to the second transmitting layer 740, which has different transmittance.

In an embodiment, the thickness of the first transmitting layer 720 is different from that of the second transmitting layer 740. In another embodiment, the material of the first transmitting layer 720 is different from that of the second transmitting layer 740. In yet another embodiment, both the material and the thickness of the first transmitting layer 720 are different from those of the second transmitting layer 740.

The mask of the present invention can be used not only in the manufacturing process of LCD devices, but also in the manufacturing process of reflective board in reflective type TFT LCDs or transflective type TFT LCDs. Moreover, the mask of the present invention can also be used in any step coverage pattern design or taper angle pattern design.

In summary, the mask and the manufacturing method thereof in the present invention have at least the following advantages:

a) The lift-off method is used in the mask manufacturing method of the present invention to simplify the manufacturing procedure of phase shift (halftone) mask and to reduce defects. Accordingly, the manufacturing cost of phase shift (halftone) mask can be reduced.

b) Compared to the manufacturing method of conventional phase shift (halftone) mask, which removes part of the phase shift (halftone) thin film through an etching process, the mask manufacturing method of the present invention uses a lift-off method to avoid uneven thickness of the phase shift (halftone) thin film incurred by uneven etching, so that phase shift (halftone) mask with even transmittance and even phase angle can be manufactured when the thickness of the phase shift (halftone) thin Film is controlled, and the yield of the production line process can be improved.

c) The mask manufacturing method of the present invention can remanufacture phase shift (halftone) mask using recycled conventional binary mask, which not only reduces the manufacturing cost of phase shift (halftone) mask considerably, but also combines the five mask manufacturing processes in the array production line of TFT LCD into four or three processes, further improving the yield of the lithography process.

d) In the present invention, a simple mask manufacturing procedure of HTPSM and MTPSM is exposed, which can be used widely in the photolithography process of displays, color filters, and semiconductors to reduce the process steps of TFT LCD array, lower the manufacturing cost, improve the shape of photoresist, and further improve the evenness of the panel and reduce the mura without adding extra equipment.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A mask manufacturing method, comprising:
   providing a transparent substrate with a first region, a second region, and a third region;
   forming a non-transmitting layer in the first region of the transparent substrate;
   forming a first photoresist layer on the transparent substrate, and the first photoresist layer exposes the second and the third region of the transparent substrate;
   forming a first transmitting layer on the transparent substrate and the first photoresist layer;
   removing the first photoresist layer, wherein the first transmitting layer located on the first photoresist layer is removed at the same time and the first transmitting layer formed in the second and the third region of the transparent substrate is remained;
   forming a second photoresist layer on the transparent substrate to cover the non-transmitting layer and the first transmitting layer in the second region and expose the first transmitting layer in the third region;
   forming a second transmitting layer on the second photoresist layer to cover the exposed first transmitting layer;
   removing the second photoresist layer, wherein the second transmitting layer located on the second photoresist layer is removed at the same time and the second transmitting layer formed on the first transmitting layer in the third region is remained.

2. The method of claim 1, wherein the material of the first transmitting layer is different from the material of the second transmitting layer.

3. The method of claim 1, wherein the thickness of the first transmitting layer is different from the thickness of the second transmitting layer.

4. The method of claim 1, wherein both the material and the thickness of the first transmitting layer are different from those of the second transmitting layer.

5. The method of claim 1, wherein the transparent substrate further includes a fourth region, wherein:
   the transparent substrate in the fourth region is exposed in the step of forming the first photoresist layer;
   the first transmitting layer is remained in the fourth region after removing the first photoresist layer;
   the fourth region is covered in the step of forming the second photoresist layer;
   the first transmitting layer in the fourth region is exposed after removing the second photoresist layer;
   after removing the second photoresist layer, further comprising:
   forming a third photoresist layer on the transparent substrate, the third photoresist layer exposes the first transmitting layer in the fourth region;
   forming a third transmitting layer on the third photoresist layer to cover the first transmitting layer in the fourth region; and
   removing the third photoresist layer, wherein the third transmitting layer located on the third photoresist layer is removed at the same time and the third transmitting layer formed on the first transmitting layer in the fourth region is remained.

* * * * *